(12) United States Patent
Saifuddin et al.

(10) Patent No.: US 7,752,522 B2
(45) Date of Patent: Jul. 6, 2010

(54) METHOD AND APPARATUS FOR RECOVERY OF PARTICULAR BITS OF A FRAME

(75) Inventors: Ahmed Saifuddin, San Diego, CA (US); Joseph P. Odenwalder, Rancho Santa Fe, CA (US); Yu-Cheun Jou, San Diego, CA (US); Edward G. Tiedemann, Jr., Concord, MA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/562,399

(22) Filed: Nov. 21, 2006

(65) Prior Publication Data

US 2007/0089040 A1  Apr. 19, 2007

Related U.S. Application Data

(62) Division of application No. 09/588,072, filed on Jun. 5, 2000, now Pat. No. 7,159,164.

(51) Int. Cl.
*H03M 13/00* (2006.01)

(52) U.S. Cl. ...................................... 714/755
(58) Field of Classification Search .................. 714/755
See application file for complete search history.

(56) References Cited

U.S. PATENT DOCUMENTS

| 4,277,844 | A | * | 7/1981 | Hancock et al. ............. 714/755 |
| 4,719,628 | A | | 1/1988 | Ozaki et al. |
| 4,779,276 | A | | 10/1988 | Kashida et al. |
| 4,845,714 | A | * | 7/1989 | Zook ............................ 714/755 |
| 4,901,307 | A | | 2/1990 | Gilhousen |
| 5,103,459 | A | | 4/1992 | Gilhousen |
| 5,200,962 | A | * | 4/1993 | Kao et al. .................... 714/774 |

(Continued)

FOREIGN PATENT DOCUMENTS

EP  200413505  2/1991

(Continued)

OTHER PUBLICATIONS

International Search Report- PCT/US01/018254, International Search Authority—European Patent Office—Feb. 14, 2002.

(Continued)

*Primary Examiner*—Joseph D Torres
(74) *Attorney, Agent, or Firm*—Rupit Patel; Sayed H. Beladi

(57) ABSTRACT

A method and an apparatus for recovery of particular bits in a frame are disclosed. An origination station forms a frame structure with groups of information bits of different importance. All the information bits are then protected by an outer quality metric. Additionally, the groups of more important information bits are further protected by an inner quality metric; each group having a corresponding quality metric. The frame is then transmitted to a destination station. The destination station decodes the received frame and decides, first in accordance with the outer quality metric, whether the frame has been correctly received, or whether the frame is erased. If the frame has been declared erased, the destination station attempts to recover the groups of more important information bits in accordance with the corresponding inner quality metrics.

11 Claims, 3 Drawing Sheets

U.S. PATENT DOCUMENTS

| | | | |
|---|---|---|---|
| 5,208,816 A | | 5/1993 | Seshadri |
| 5,392,129 A | | 2/1995 | Ohtaka |
| 5,412,667 A | | 5/1995 | Havemose |
| 5,416,804 A | | 5/1995 | Khaled et al. |
| 5,436,917 A | * | 7/1995 | Karasawa ............... 714/755 |
| 5,446,744 A | | 8/1995 | Nagasawa et al. |
| 5,504,759 A | | 4/1996 | Inoue et al. |
| 5,606,569 A | * | 2/1997 | MacDonald et al. ........ 714/758 |
| 5,627,935 A | | 5/1997 | Kim |
| 5,666,370 A | * | 9/1997 | Ganesan et al. ............ 714/752 |
| 5,710,784 A | | 1/1998 | Kindred et al. |
| 5,712,861 A | | 1/1998 | Inoue et al. |
| 5,719,884 A | * | 2/1998 | Roth et al. ............... 714/755 |
| 5,740,187 A | | 4/1998 | Tanaka |
| 5,751,725 A | | 5/1998 | Chen |
| 5,774,496 A | | 6/1998 | Butler et al. |
| 5,905,741 A | | 5/1999 | Matsukuma et al. |
| 5,923,679 A | | 7/1999 | Ito et al. |
| 5,949,790 A | | 9/1999 | Pehkonen et al. |
| 5,974,580 A | * | 10/1999 | Zook et al. ............... 714/755 |
| 6,029,264 A | * | 2/2000 | Kobayashi et al. .......... 714/755 |
| 6,031,874 A | * | 2/2000 | Chennakeshu et al. ...... 375/262 |
| 6,112,324 A | | 8/2000 | Howe et al. |
| 6,170,073 B1 | | 1/2001 | Jarvinen et al. |
| 6,173,431 B1 | * | 1/2001 | Rittle ..................... 714/778 |
| 6,178,535 B1 | * | 1/2001 | Kajala et al. .............. 714/752 |
| 6,223,324 B1 | * | 4/2001 | Sinha et al. ............... 714/776 |
| 6,272,659 B1 | * | 8/2001 | Zook ..................... 714/774 |
| 6,301,558 B1 | * | 10/2001 | Isozaki .................. 704/228 |
| 6,378,101 B1 | * | 4/2002 | Sinha et al. ............... 714/755 |
| 6,397,366 B1 | | 5/2002 | Tanaka et al. |
| 6,445,702 B1 | | 9/2002 | Wright |

FOREIGN PATENT DOCUMENTS

| | | |
|---|---|---|
| GB | 2343346 | 9/2008 |
| WO | 9508888 | 3/1995 |
| WO | 9908425 | 2/1999 |
| WO | 0027037 | 5/2000 |
| WO | 0152467 | 7/2001 |

OTHER PUBLICATIONS

Alaten, A. et al. "Unequal Error Protection of SPIHT Encoded Image Bit Streams" IEEE Journal on Selected Areas in Communications, vol. 18, No. 6, pp. 814-818 (Jun. 2000).

Cheung, T. et al. "Adaptive unequal error Protection and VLC Reshuffling for Image Transmission Over Wireless Channels" Vehicular technology Conf. Proceedings, VTC 2000-Spring Tokyo 2:800-804 (2000).

Gadkari, S. et al. "Time-division Versus Superposition Coded Modulation Schemes for Unequal Error Protection" IEEE Transactions on Communications, vol. 47, No. 3, pp. 370-379 (Mar. 1999).

Heinzelman, W. et al. "Unequal error Protection of MPEG-4 Compressed Video" 1999 International conference on Image Processing 2: 530-534 (1999).

Hindelang, T. et al. "Improved Channel Coding and Estimation for Adaptive Multi-Rate (AMR) Speech Transmission" IEEE pp. 1210-1214 (2000).

Mukherjee, D. et al. "A Vector Set Partitioning Noisy Channel Image Coder With Unequal Error Protection" IEEE Journal on Selected Areas in Communications, vol. 18, No. 6, pp. 829-840 (2000).

Sun, Z. et al. "Adoptive Two-level Unequal Error Protection Convolutional Code Scheme for Wireless ATM Networks" IEEE INFOCOM pp. 1693-1697 (2000).

Targali, Y.M. et al. "Unequal Error Protection for Image Transmission Over GSM Networks" IEEE European workshop: Dec. 1-Dec. 13, 1999.

Yap, C. et al. "Unequal Error Protection of Images over Rayleigh Fading Channels"5th Intl Symposium on Signal Processing and Its Applications, ISSPA '99, pp. 19-22 (Aug. 1999).

TIA/EIA/IS-95-B "Mobile Station-Base Station Compatibility Standard for Wide-band spread Spectrum Cellular Systems." Mar. 1999.

* cited by examiner

METHOD AND APPARATUS FOR RECOVERY OF PARTICULAR BITS OF A FRAME

CLAIM OF PRIORITY UNDER 35 U.S.C. §120

The present Application for Patent is a divisional of patent application Ser. No. 09/588,072 entitled "METHOD AND APPARATUS FOR RECOVERY OF PARTICULAR BITS OF A FRAME" filed Jun. 5, 2000, now allowed, and assigned to the assignee hereof and hereby expressly incorporated by reference herein.

BACKGROUND OF THE INVENTION

I. Field of the Invention

The current invention relates to communication. More particularly, the present invention relates to a novel method and apparatus for recovery of particular bits of a corrupted frame.

II. Description of the Related Art

Communication systems have been developed to allow transmission of information signals from an origination station to a physically distinct destination station. In transmitting an information signal from the origination station over a communication channel, the information signal is first converted into a form suitable for efficient transmission over the channel. Conversion, or modulation, of the information signal involves varying a parameter of a carrier wave in accordance with the information signal in such a way that the spectrum of the resulting modulated carrier is confined within the channel bandwidth. At the destination station the original message signal is replicated from a version of the modulated carrier received subsequent to propagation over the channel. Such replication is generally achieved by using an inverse of the modulation process employed by the origination station.

Furthermore, the conversion is selected in accordance with additional characteristics of the channel, including, but not being limited to, signal-to-noise ratio, fading, time variance, and others known to one skilled in the art. Thus, transmission of an information signal over a wireless communication channel will require different consideration than transmission over a wire-like channel, e.g., coaxial cable, optical cable, and others known to one skilled in the art.

Modulation also facilitates multiple-access, i.e., simultaneous transmission, of several signals over a common channel. Multiple-access communication systems often include a plurality of remote subscriber units requiring intermittent service of relatively short duration rather than continuous access to the communication channel.

There are several multiple-access communication system techniques, such as time division multiple-access (TDMA), frequency division multiple-access (FDMA), and amplitude modulation (AM) schemes such as amplitude companded single sideband known in the art. Another type of multiple-access spread spectrum system is a code division multiple-access (CDMA) modulation system that conforms to the "TIA/EIA/IS-95 Mobile Station-Base Station Compatibility Standard for Dual-Mode Wide-Band Spread Spectrum Cellular System," hereinafter referred to as the IS-95 standard. The CDMA system supports voice and data communication between users over a terrestrial link. The use of CDMA techniques in a multiple-access communication system is disclosed in U.S. Pat. No. 4,901,307, entitled "SPREAD SPECTRUM MULTIPLE-ACCESS COMMUNICATION SYSTEM USING SATELLITE OR TERRESTRIAL REPEATERS," and U.S. Pat. No. 5,103,459, entitled "SYSTEM AND METHOD FOR GENERATING WAVEFORMS IN A CDMA CELLULAR TELEPHONE SYSTEM," both assigned to the assignee of the present invention and incorporated herein by reference.

In the above-referenced U.S. Pat. No. 4,901,307, a multiple-access technique is disclosed allowing a large number of mobile telephone system users, each having a transceiver, communicate through satellite repeaters or terrestrial base stations using CDMA spread spectrum communication signals. In using CDMA communications, the frequency spectrum can be reused multiple times thus permitting an increase in system user capacity. The use of CDMA results in a much higher spectral efficiency than can be achieved using other multiple-access techniques.

In general, the transmitted information signal is divided into a number of "frames," each of which includes a specified number of information bits and a number of quality metric bits. Each frame is processed in accordance with a selected modulation scheme, and transmitted over a communication channel. At the destination station, the frame is extracted from the communication channel by demodulation. In order to ascertain integrity of information in the extracted signal, the information bits in the frame are protected by a quality metric derived from the information bits. Such a quality metric may be a parity bit, a cyclic redundancy check (CRC), or any other quality metric known to one skilled in the art. Upon extraction of the signal from the received frame, a quality metric is determined from the extracted information bits and compared with the extracted quality metric. If the two quality metrics match, the frame is considered correctly received. Otherwise, the frame is declared erased.

The above-described integrity check works well when all the information bits in the frame are equally important. However, certain applications may use frames with bits grouped into blocks of different importance. An example of a frame of this structure is disclosed in co-pending provisional application Ser. No. 60/175,371, entitled "Accommodating the WCDMA AMR Data Rates in IS-2000 MC," filed Jan. 10, 2000, assigned to the assignee of the present invention, and incorporated herein by reference. The Adaptive Multi-Rate (AMR) speech coder groups the information bits into three classes called class A, class B, and class C. In a Wideband Code Division Multiple-access (WCDMA) system, each class of bits is sent on a different transport channel with possibly different coding and rate matching. The Class A bits are the most important bits, then the Class B bits, and finally the Class C bits. A WCDMA approach uses an 8-bit CRC and a tailed-off convolutional coding for the Class A bits, no CRC and tailed-off convolutional coding for the Class B bits, and no CRC or convolutional coding for the Class C bits. The Telecommunication Industry Association (TIA) Industry Standard-2000 Multi-Carrier (IS-2000 MC) accommodates the AMR speech coder by forming a single frame comprising all three classes A, B, and C with reverse ordering of the AMR information bit classes so that the last (least important) bit class (Class C) is sent first. Because the flexible-rate puncturing starts from the first encoded and repeated symbols and stops after the necessary number of symbols are punctured, the bits located at the end of the frame are more reliable. Puncturing is a technique that affects bit, or bits, legitimately belonging at certain location in a frame. Thus, for example, in power control puncturing, information bits at certain locations are replaced by power control bits. In another example, interleaving may generate bits exceeding a frame length, and the excess bits are discarded. The frame is encoded by a single, tailed-off convolutional code. A single CRC with a length depending on the number of information bits is determined in accordance with all the information bits. Such a frame is depicted in FIG. 1. FIG. 1 shows a frame structure 100, in which the information bits within the frame are classified as class A 106, class B 104, and class C 102. The different classes are of different importance. In accordance with the method known in the art, all the information bits are protected by a single CRC 108. The frame also contains tail bits 110. The tail bits 110 do not carry any information, and are all zeros. The tail bits 110 are used to initialize an encoder (not shown) for the next frame. However, if the CRC integrity check fails, all the information bits, regardless of their importance, are unrecoverable.

The above description uses a wireless communication system as a particular example of a frame with bits of different importance. One skilled in the art will appreciate that this is for explanatory purposes only because the problem of recovery of particular bits of an erased frame is inherent in any communication system.

Because it may be desirable to recover the relatively more important block, or blocks, of bits from an erased frame, there exists a need in the art for an integrity check mechanism allowing recovery of the block, or blocks, of bits from an erased frame.

SUMMARY OF THE INVENTION

The present invention is directed to a novel method and apparatus for recovery of particular bits of a received frame in a communication system.

Accordingly, at the origination station a frame of data is formed first by determining an outer quality metric in accordance with a plurality of information bits. Then, at least one inner quality metric is determined in accordance with a group of information bits. The frame comprising at least the plurality of information bits, the outer quality metric, and the at least one inner quality metric is transmitted to the destination station.

The destination station first attempts to recover the at least one group of information bits when the outer quality metric indicates that the frame has been received correctly. When the frame has not been received correctly, the at least one group of information bits can still be recovered. The recovery is possible when the inner quality metric corresponding to the at least one group of information bits indicates that the at least one group of information bits in the frame has been received correctly.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF PREFERRED EMBODIMENTS

Figure 2:
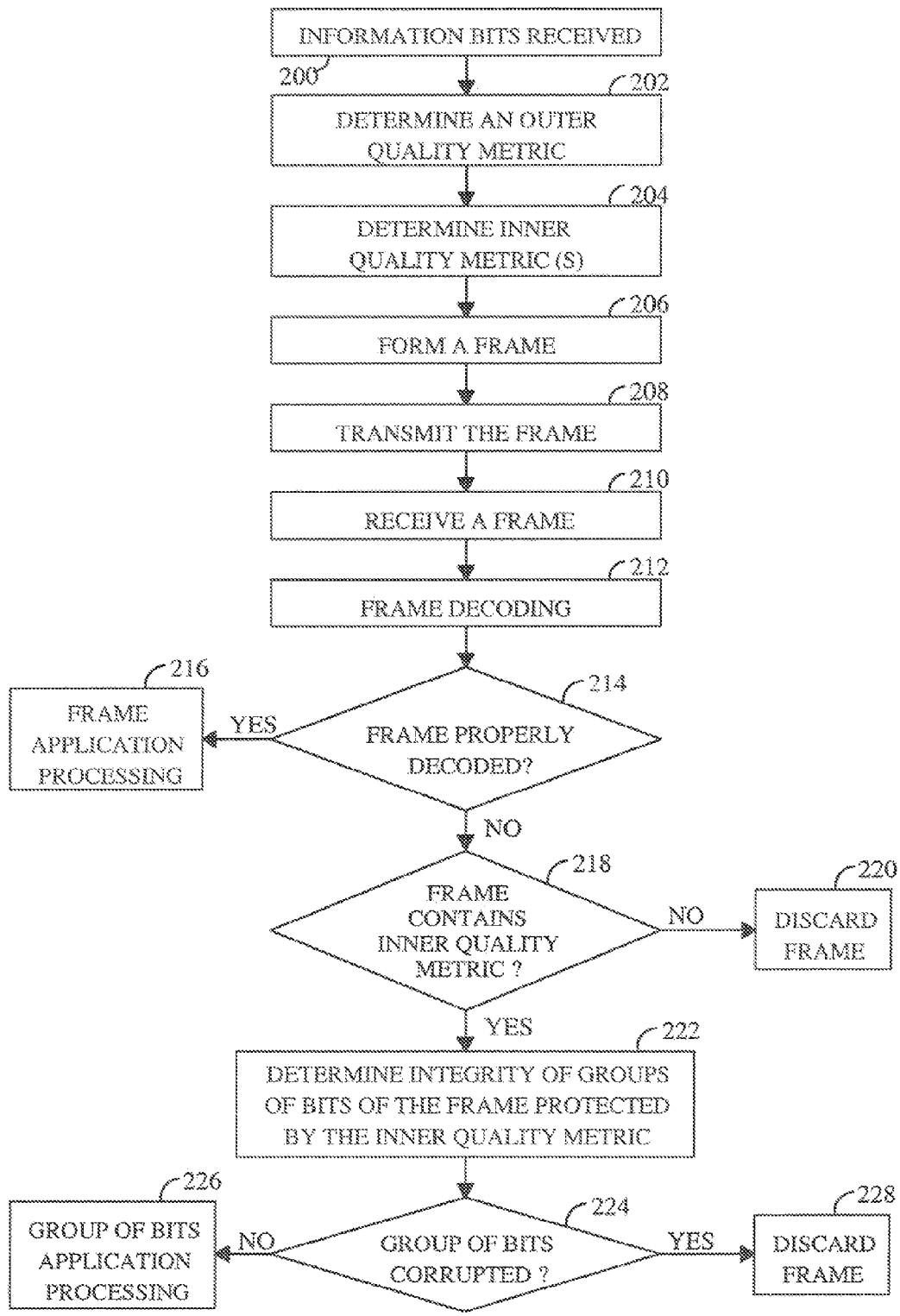
FIG. 2 is a flowchart of a method using multiple CRC to recover particular bits from a frame of data in accordance with one embodiment.

FIG. 2 is a flowchart of a method using multiple CRC to recover particular bits from a frame of data in accordance with one embodiment.

At step 200, information bits to form a frame are received. In one embodiment of the invention, the information bits are produced by an AMR speech coder. Control flow then proceeds to step 202.

At step 202, an outer quality metric is determined in accordance with all the information bits. In one embodiment, the quality metric is a CRC. Control flow then proceeds to step 204.

At step 204, an inner quality metric is determined. As explained, a certain group, or groups, of bits of the information bits in a frame may be considered of higher importance, warranting further protection. Therefore, an additional inner quality metric is determined in accordance with the information bits of each such group. In one embodiment, the inner quality metric is a CRC. In one embodiment, using the information bits produced by an AMR speech coder, one inner CRC protecting one group of bits (class A) is used. Control flow then proceeds to step 206.

At step 206, the frame, comprising the information bits, the inner quality metric, the outer quality metric(s), and tail bits, is formed. In one embodiment, the information bits produced by an AMR speech coder are used, resulting in the frame structure shown in FIG. 3. Control flow then proceeds to step 208.

At step 208, the frame is conveyed from an origination station (not shown) to a destination station (not shown). Step 208 includes any processing of the frame antecedent to the conveyance. One skilled in the art will appreciate that the processing depends on many variables. Such variables include, but are not limited to, the transmission media, i.e., wireless or wire-like; modulation, i.e., code division, frequency division, time division; and other variables known to one skilled in the art. Because the present invention can be used independently of such variables, the processing is not discussed further. In one embodiment, accommodating AMR speech coder data rates in IS-2000 MC, the processing is performed in accordance with IS-2000 MC. Control flow then proceeds to step 210.

At step 210, the frame is received at the destination station (not shown). Step 210 includes any processing of the frame antecedent to decoding. In one embodiment, accommodating the AMR speech coder data rates in IS-2000 MC, the processing is performed in accordance with IS-2000 MC. Control flow then proceeds to step 212.

At step 212, the frame is decoded. As used in step 212, the term "decoded" describes the process of receiving an encoded frame and outputting a signal indicating whether the frame has been correctly received or the frame is erased. The outer quality metric is used in step 212. In one embodiment, a decoder (not shown) has no information about the rate at which the frame was transmitted by the origination station (not shown). Therefore, the decoder must also determine at which of several rates the frame has been transmitted by the origination station. A detailed example of such a decoder is disclosed in U.S. Pat. No. 5,751,725, entitled "METHOD AND APPARATUS FOR DETERMINING THE RATE OF RECEIVED DATA IN A VARIABLE RATE COMMUNICATION SYSTEM," assigned to the assignee of the present invention, and incorporated herein by reference. A simplified description of an exemplary decoding process in accordance with U.S. Pat. No. 5,751,725 is provided in reference to FIG. 4. One skilled in the art will appreciate that the description is meant for explanatory purposes only, and any other structure capable of the function described can be utilized. In another embodiment, the decoder has information about the rate at which the frame was transmitted by the origination station. Control flow then proceeds to step 214.

At step 214, the decision of further processing of the frame is made based on a signal indicating whether the frame has been correctly received or erased. If the frame is declared correctly received, the control flow continues in step 216. Otherwise, the control flow continues in step 216.

At step 216, the frame is processed in accordance with the intended application of the frame because all the information bits in the frame has been correctly received. In one embodiment, accommodating the AMR speech coder data rates in IS-2000 MC, the processing is performed by a Multiplex Sublayer in accordance with IS-2000 MC. Control flow then proceeds to step 218.

At step 218, a determination whether a frame contains an inner quality metric is performed. In one embodiment, the determination is performed in accordance with a hypothesis of data rate because the protocol governing frame formation determines what data rates contain inner quality metric. In another embodiment, the frame may contain overhead bits indicating whether the frame contains inner quality metric or not. If the frame does not contain an inner metric, the control flow continues in step 220. Otherwise, the flow continues in step 222.

At step 220, the processing of the frame ends, and the frame is discarded.

At step 222, the frame is processed again with respect to integrity of the group or groups of bits of the frame protected by a corresponding inner quality metric. One embodiment of integrity determination is discussed in detail with reference to FIG. 4. Control flow then proceeds to step 224.

At step 224, the result of integrity determination is tested. If the inner quality metric indicates that integrity of the group of bits is intact, the flow continues in step 226. Otherwise, the flow continues in step 228.

At step 226, the group of bits is processed in accordance with the intended function. An example of such processing is passing the group of bits to an AMR vocoder (not shown).

At step 228, the processing of the frame ends, and the frame is discarded.

Figure 1:
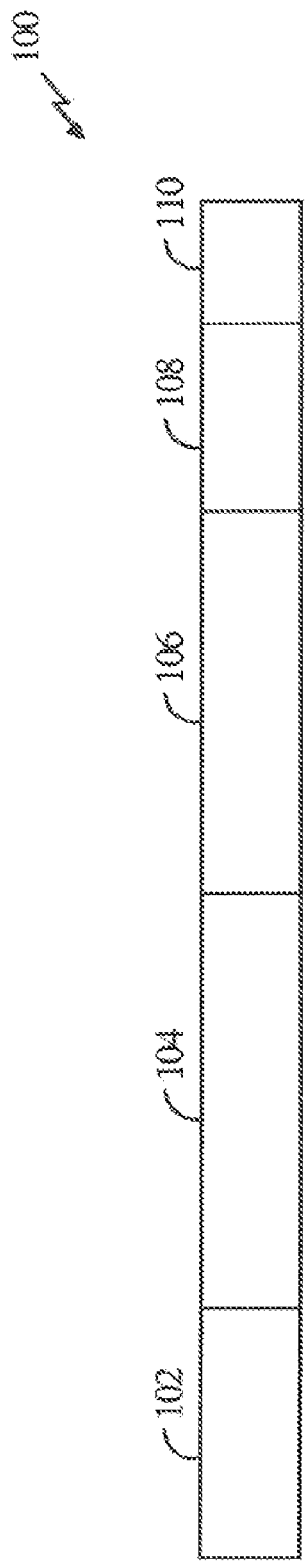
FIG. 1 shows a frame structure with groups of bits of different importance protected by a single quality metric.
Figure 3:
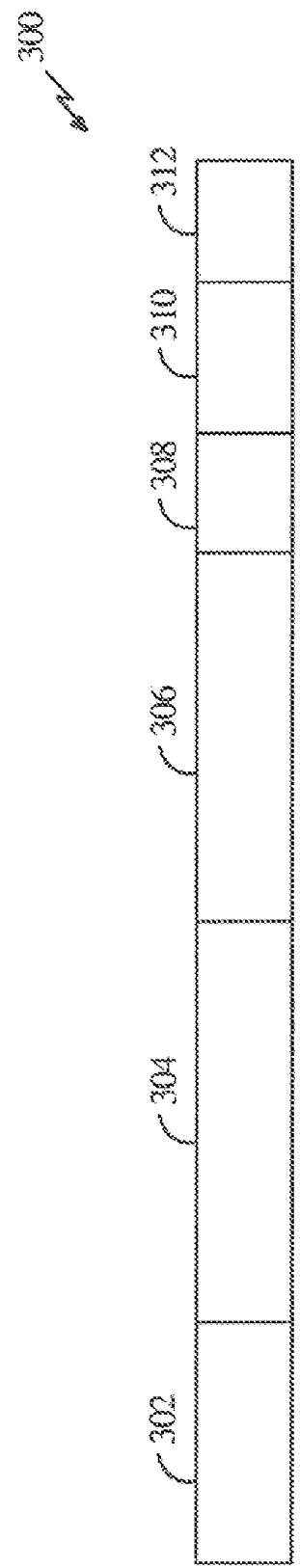
FIG. 3 shows a frame structure with groups of bits of different importance protected by quality metrics in accordance with one embodiment of the invention.

FIG. 3 shows a frame structure 300 with groups of bits of different importance protected by quality metrics in accordance with an embodiment of the invention. The frame structure 300 contains three classes of information bits: class A 306, class B 304, and class C 302. The different classes are of different importance. For the purposes of this discussion, it is assumed that class A 306 information bits are more important than class B 304 and class C 302 bits. All the information bits are protected by an outer CRC 310. The more important information bits of class A 306 are further protected by an inner CRC 308. The frame also contains tail bits 312. The tail bits 312 do not carry any information, and are all zeros. The tail bits 312 are used to initialize an encoder (not shown) for the next frame.

Although the particular embodiment of a frame structure is described as having only one group of bits (class A 306) protected by an inner CRC, one skilled in the art will understand that the method can be extended to any number of groups. Thus, if an additional protection of class B 304 bits were desired, an additional inner CRC (not shown) protecting the class B 304 bits would be added to the frame structure 300.

One skilled in the art will appreciate that there are numerous circuit structures that can form the frame structure 300. Such a circuit structure may be, e.g., a general-purpose processor, a digital signal processor, a programmable logic array, or any other device designed to perform the functions described herein that is known to one skilled in the art. Furthermore, the processor may receive a set of instructions from a memory coupled to the processor. The memory may be a part of the above-mentioned processor or processors, or be a separate element. The implementation of the memory is a design choice. Thus, the memory can be any medium capable of storing information, e.g., a magnetic disk, a semiconductor integrated circuit, and other storage media known to one skilled in the art.

Figure 4:
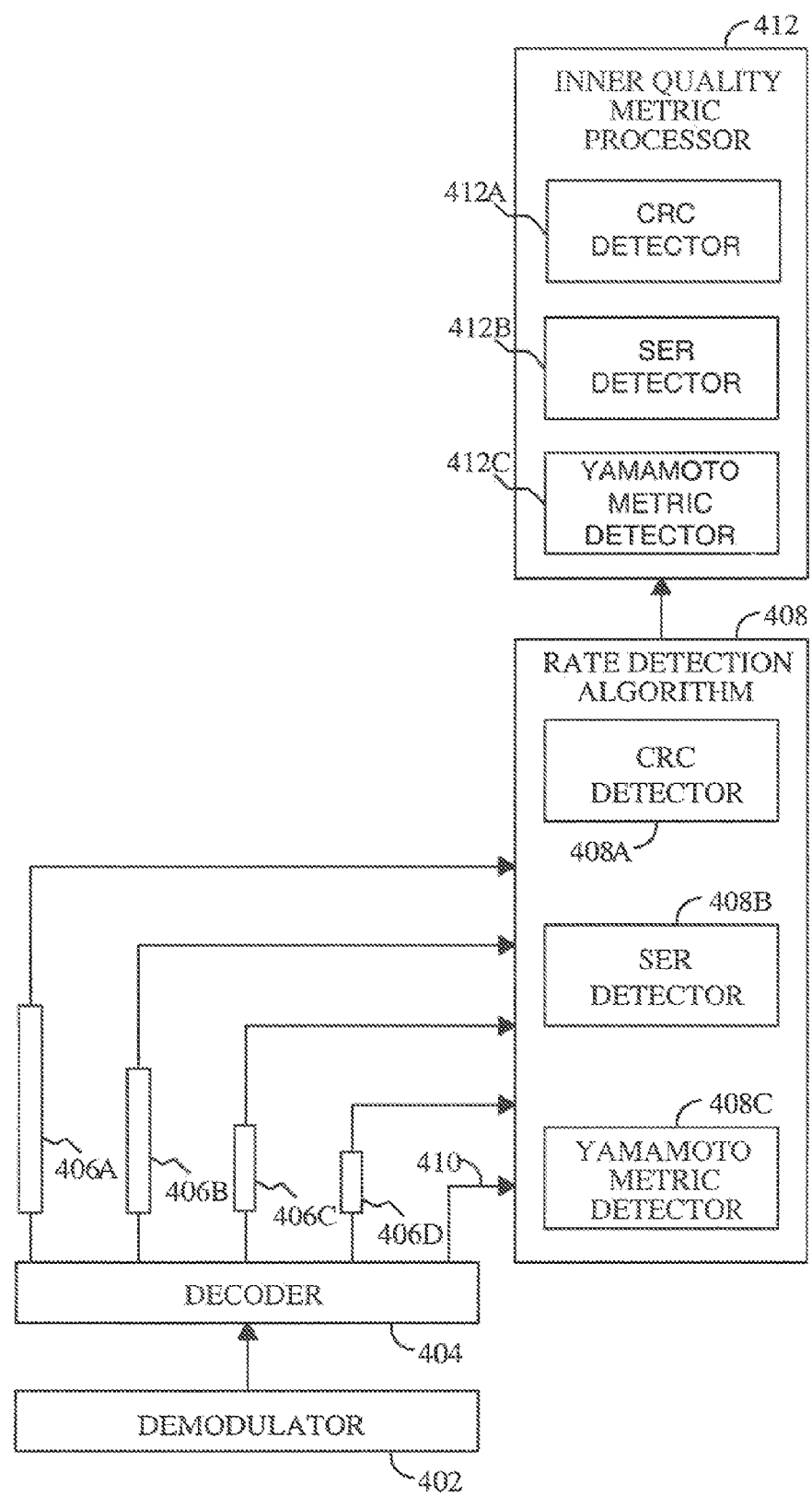
FIG. 4 is a simplified block diagram of a circuitry in accordance with one embodiment of the present invention.

FIG. 4 is a simplified block diagram of a circuitry in accordance with one embodiment of the present invention.

A frame outputted by a demodulator 402 is provided to a multi-rate decoder 404, which provides error correction on the frame. The decoder 404 decodes the data based on a predetermined set of rate hypotheses. In an exemplary embodiment, the decoder 404 is a multi-rate Viterbi decoder disclosed in U.S. Pat. No. 5,710,784, entitled "MULTIRATE SERIAL VITERBI DECODER FOR CDMA SYSTEM APPLICATIONS," assigned to the assignee of the present invention, and incorporated herein by reference.

In an exemplary embodiment, the decoder 404 decodes the frame symbols for each of the possible rates to provide separately decoded frames of data, and stores the decoded frames in buffers 406a, 406b, 406c, 406d. Although only four data rates are shown, one skilled in the art will appreciate that the concept is equally applicable to any number of data rates. Outputs of each data buffer 406a, 406b, 406c, 406d are provided to Rate Detection Algorithm (RDA) logic 408.

The RDA logic 408 contains a CRC detector 408a. The CRC detector 408a determines whether the CRC received in the frame matches the CRC determined from each of the decoded frames of data. The CRC detector 408a performs a CRC check for the CRC bits in the four decoded frames to help determine whether the currently received frame was transmitted at the full, half, quarter, or eighth rates. The CRC detector 408a provides four check bits, C1, C2, C4, and C8 corresponding to the possible rates.

In addition, in one embodiment, the RDA logic 408 contains a symbol error rate (SER) detector 408b. The SER detector 408b receives the decoded bits 410. The SER detector 408b also receives an estimate of the received symbol data from the buffers 406a, 406b, 406c, 406d. The SER detector 408b re-encodes the decoded bits 410, and compares them to the estimate of the received symbol data from the buffers 406a, 406b, 406c, 406d. The SER is a count of the number of discrepancies between the re-encoded symbol data and the received symbol data from the buffers 406a, 406b, 406c, 406d. Therefore, the SER detector 408b generates four SER values: SER1, SER2, SER4, and SER8. The SER values of different frame rates are normalized to account for the difference in the number of symbols per frame. The SER values help provide a determination of the rate of the current frame and integrity of the frame, in addition to the CRC bits.

Furthermore, in one embodiment, the RDA logic 408 contains a Yamamoto metric detector 408c, which provides a confidence metric in accordance with the difference between the selected path through a trellis and the next closest path through the trellis. While the CRC check is dependent on the bits in each of the four decoded frames, the Yamamoto check is dependent on the frame processing antecedent to decoding.

The Yamamoto detector 408c provides four Yamamoto values for each of the four possible rates: Y1, Y2, Y4, and Y8.

The RDA logic 408 receives the CRC check bits, SER values, and Yamamoto values from the detectors 408a, 408b, 408c, respectively. The RDA logic 408 then determines at which of the four rates the currently received frame was sent. In accordance with the rate determined by the RDA logic 408, a signal is provided to the decoded frame buffers 406a, 406b, 406c, 406d. A particular frame buffer 406a, 406b, 406c, 406d outputs the stored frame decoded at the determined rate for further processing, or outputs no frame if an erasure is declared. In an alternate embodiment, the RDA logic 408 outputs a signal indicative of a frame erasure if an erasure is declared.

When the RDA logic 408 declares a frame erasure, the contents of those frame buffers 406a, 406b, 406c, 406d that contain a frame with an inner quality metric is provided to an Inner Quality Metric Processor (IQMP) 412. In one embodiment, the function of the IQMP 412 is similar to the function of the RDA logic 408, i.e., receiving decoded frames of data at the possible rates that contain a frame with an inner quality metric, and outputting a signal indicating whether the groups of bits protected by the inner quality metric are intact. In one embodiment, the IQMP 412 has no information about the rate at which the frame was transmitted by the origination station (not shown). Therefore, the IQMP 412 must also determine at which of the several rates the frame has been transmitted by the origination station. Consequently, the structure of the IQMP 412 may advantageously be similar to the RDA logic 408. Thus, in one embodiment, the IQMP 412 contains a CRC detector 412a, an SER detector 412b, and a Yamamoto metric detector 412c, functioning in substantially similar manner as the CRC detector 408a, the SER detector 408b, and the Yamamoto metric detector 408c. The CRC detector 412a, the SER detector 412b, and the Yamamoto metric detector 412c operate only on the group of bits of the frame that is protected by the inner quality metric.

The IQMP 412 receives the CRC check bits, SER values, and Yamamoto values from the detectors 412a, 412b and 412c, respectively. The IQMP 412 then determines at which of the rates, containing an inner quality metric, was the currently received frame sent. In accordance with the rate determined by the IQMP 412, the group of bits decoded at the determined rate is outputted for further processing. Alternatively, the frame is discarded if the IQMP 412 fails to determine the rate.

Though the decoder 404, the RDA logic 408, and the IQMP 412 are shown as separate elements, one skilled in the art will appreciate that the physical distinction is made for explanatory purposes only. The decoder 404, the RDA logic 408, and the IQMP 412 may be incorporated into single processor accomplishing the above-mentioned processing. Thus, such a processor may be, e.g., a general-purpose processor, a digital signal processor, a programmable logic array, or any other device designed to perform the functions described herein that is known to one skilled in the art. Furthermore, the processor may receive a set of instructions from a memory coupled to the processor. The memory may be a part of the above-mentioned processor or processors, or be a separate element. The implementation of the memory is a design choice. Thus, the memory can be any medium capable of storing information, e.g., a magnetic disk, a semiconductor integrated circuit, or any other storage media known to one skilled in the art.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A method comprising:
   receiving a wireless frame comprising a plurality of groups corresponding to different classes, an outer-quality metric bit and an inner quality metric bit, the outer quality metric bit being used to verify whether the wireless frame has been received correctly and the inner quality metric bit being used to verify whether a corresponding group of information bits of a particular class contained in the wireless frame has been received correctly;
   recovering information contained in the wireless frame including the corresponding group of information bits if it is determined that the wireless frame has been correctly received as indicated by the outer quality metric bit; and
   if it is determined that the wireless frame has not been received correctly as indicated by the outer quality metric bit but the corresponding group of information bits has been correctly received as indicated by the inner quality metric bit, recovering the corresponding group of information bits from the wireless frame which has not been received correctly.

2. The method of claim 1 further comprising:
   determining whether the wireless frame has been received correctly by checking the outer quality metric bit; and
   if the wireless frame has not been received correctly as indicated by the outer quality metric bit, determining whether the corresponding group of information bits has been correctly received by checking the inner quality metric bit.

3. The method of claim 1 wherein the inner quality metric bit comprises a cyclic redundancy check (CRC) bit.

4. The method of claim 1 wherein the inner quality metric bit comprises a parity bit.

5. An apparatus comprising:
   a decoder configured to:
   receive and decode a wireless frame comprising a plurality of groups corresponding to different classes, an outer quality metric bit and an inner quality metric bit, the outer quality metric bit being used to verify whether the wireless frame has been received correctly, and
   recover information contained in the wireless frame including a corresponding group of information bits if it is determined that the wireless frame has been received correctly as indicated by the outer quality metric bit; and
   an inner quality metric processor coupled with the decoder for receiving an inner quality metric bit, the inner quality metric bit being used to verify whether the corresponding group of information bits of a particular class contained in the wireless frame has been received correctly,
   wherein, if it is determined that the wireless frame has not been received correctly by the decoder as indicated by the outer quality metric bit but the corresponding group of information bits has been correctly received by the decoder as indicated by the inner quality metric bit, the corresponding group of information bits is recovered, using the decoder, from the wireless frame which has not been received correctly.

6. The apparatus of claim 5 wherein the decoder is further configured to determine whether the wireless frame has been received correctly by checking the outer quality metric bit, and if the wireless frame has not been correctly received as indicated by the outer quality metric bit, the decoder determines whether the corresponding group of information bits has been correctly received by checking the inner quality metric bit.

7. An apparatus comprising:

means for receiving a wireless frame comprising a plurality of groups corresponding to different classes, an outer quality metric bit and an inner quality metric bit, the outer quality metric bit being used to verify whether the wireless frame has been received correctly and the inner quality metric bit being used to verify whether a corresponding group of information bits of a particular class contained in the wireless frame has been received correctly;

means for recovering information contained in the wireless frame including the corresponding group of information bits if it is determined that the wireless frame has been correctly received as indicated by the outer quality metric bit; and means for recovering, if it is determined that the wireless frame has not been received correctly as indicated by the outer quality metric bit but the corresponding group of information bits has been correctly received as indicated by the inner quality metric bit, the corresponding group of information bits from the wireless frame which has not been received correctly.

8. A tangible computer-readable media comprising a computer program including a set of instructions for executing a process for a wireless communication device, the process comprising:

receiving a wireless frame comprising a plurality of groups corresponding to different classes, an outer quality metric bit and an inner quality metric bit, the outer quality metric bit being used to verify whether the wireless frame has been received correctly and the inner quality metric bit being used to verify whether a corresponding group of information bits of a particular class contained in the wireless frame has been received correctly;

recovering information contained in the wireless frame including the corresponding group of information bits if it is determined that the wireless frame has been correctly received as indicated by the outer quality metric bit; and if it is determined that the wireless frame has not been received correctly as indicated by the outer quality metric bit but the corresponding group of information bits has been correctly received as indicated by the inner quality metric bit, recovering the corresponding group of information bits from the wireless frame which has not been received correctly.

9. The process of claim 8 further comprising:

determining whether the wireless frame has been received correctly by checking the outer quality metric bit; and if the wireless frame has not been received correctly as indicated by the outer quality metric bit, determining whether the corresponding group of information bits has been correctly received by checking the inner quality metric bit.

10. The process of claim 8 wherein the inner quality metric bit comprises a cyclic redundancy check (CRC) bit.

11. The process of claim 8 wherein the inner quality metric bit comprises a parity bit.

* * * * *